(12) United States Patent
Wang

(10) Patent No.: US 10,431,689 B2
(45) Date of Patent: Oct. 1, 2019

(54) THIN FILM TRANSISTOR AND DISPLAY DEVICE

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventor: Xiao Wang, Guangdong (CN)

(73) Assignee: SHENZHEN CHINA STAR OPTOELECTRONICS SEMICONDUCTOR DISPLAY TECHNOLOGY CO., LTD., Shenzhen (CN)

(*) Notice: Subject to any disclaimer, the term of this patent is extended or adjusted under 35 U.S.C. 154(b) by 0 days.

(21) Appl. No.: 15/743,122

(22) PCT Filed: Nov. 23, 2017

(86) PCT No.: PCT/CN2017/112603
§ 371 (c)(1),
(2) Date: Jan. 9, 2018

(87) PCT Pub. No.: WO2019/090842
PCT Pub. Date: May 16, 2019

(65) Prior Publication Data
US 2019/0140100 A1 May 9, 2019

(30) Foreign Application Priority Data
Nov. 7, 2017 (CN) .......................... 201711088246.9

(51) Int. Cl.
*H01L 29/786* (2006.01)
*H01L 23/373* (2006.01)
*H01L 27/12* (2006.01)

(52) U.S. Cl.
CPC ...... *H01L 29/78606* (2013.01); *H01L 23/373* (2013.01); *H01L 23/3731* (2013.01); *H01L 23/3732* (2013.01); *H01L 27/1214* (2013.01)

(58) Field of Classification Search
CPC . H01L 23/36–3738; H01L 29/06–0696; H01L 29/4908; H01L 29/66742–6678;
(Continued)

(56) References Cited

U.S. PATENT DOCUMENTS 5,583,366 A * 12/1996 Nakazawa ........ H01L 21/28079
257/347
2002/0021266 A1 2/2002 Koyama et al.
(Continued)

FOREIGN PATENT DOCUMENTS

| CN | 1825650 A | 8/2006 |
| CN | 102738171 A | 10/2012 |
| CN | 207199630 U | 4/2018 |

*Primary Examiner* — Daniel P Shook
(74) *Attorney, Agent, or Firm* — Hauptman Ham, LLP

(57) ABSTRACT

The disclosure discloses a thin film transistor and a display panel. The thin film transistor includes a gate, a source, a drain, an active layer, and a heat transmitting layer; wherein the heat transmitting layer is arranged on a side of the active layer. In the disclosure, the heat of the active layer may be promptly conducted to the surrounding environment, so as to prevent the self-heating effect of the thin film transistor from affecting the normal working state.

6 Claims, 6 Drawing Sheets

(58) Field of Classification Search
CPC .... H01L 29/786–78696; H01L 51/0512–0566
See application file for complete search history.

(56) References Cited

U.S. PATENT DOCUMENTS

| | | |
|---|---|---|
| 2003/0186561 A1* | 10/2003 | Law ..................... C23C 16/402 438/788 |
| 2005/0051774 A1 | 3/2005 | Koyama et al. |
| 2005/0110132 A1* | 5/2005 | Yokoyama ........ H01L 29/78603 257/706 |
| 2011/0037073 A1 | 2/2011 | Ahn et al. |
| 2013/0334502 A1 | 12/2013 | Liu |
| 2018/0114933 A1 | 4/2018 | Huang |
| 2018/0190490 A1 | 7/2018 | Ma et al. |

\* cited by examiner

THIN FILM TRANSISTOR AND DISPLAY DEVICE

RELATED APPLICATIONS

The present application is a National Phase of International Application Number PCT/CN2017/112603, filed Nov. 23, 2017, and claims the priority of China Application No. 201711088246.9, filed Nov. 7, 2017.

FIELD OF THE DISCLOSURE

The disclosure relates to a display technical field, and more particularly to a thin film transistor and a display device.

BACKGROUND

Currently, a thin film transistor has been widely used in a liquid crystal display technology, an organic electroluminescent display technology and integrated circuits, for example, as a switch of a pixel unit in an active matrix display device or as a basic unit driven by a row of an array substrate, so as to form a gate drive circuit. The display device manufactured by the thin film transistor has the advantages of simpler technical process and higher integration of the panel. Therefore, the thin film transistor plays an important role in the flat panel display technology.

After a long term research and development, the inventor of the disclosure found that the thin film transistor generally uses a transparent glass as a substrate, silicon nitride or silicon oxide as a gate insulating layer, and an active layer is arranged on a substrate or a gate insulating layer. Because the thermal conductivity glass, silicon nitride and silicon oxide is low, when the current flowing through the active layer is high, the heat generated may not be quickly transmitted to the surrounding environment through the substrate and the gate insulating layer, easy to cause self-heating effect of the thin film transistor, so operating parameters of the thin film transistor, such as the threshold voltage, the ON state current ($I_{on}$), the OFF state current ($I_{off}$) and the sub-threshold swing, are changed, thereby affecting the normal operation state of the thin film transistor.

SUMMARY

The disclosure provides a thin film transistor and a display device to solve the technical problem below: the heat of the active layer of the thin film transistor may not be dissipated in the prior art and this may affect the normal operation state of the thin film transistor.

In order to solve the above technical problem, one technical solution adopted by the disclosure is to provide a thin film transistor, including:

a gate, a source, a drain, an active layer, and a heat transmitting layer, wherein the heat transmitting layer is arranged on a side of the active layer.

In order to solve the above technical problem, another technical solution adopted by the disclosure is to provide a display device comprising the thin film transistor as described above.

In the disclosure, the heat transmitting layer is arranged on one side of the active layer of the thin film transistor, so that the heat of the active layer may be promptly conducted to the surrounding environment, so as to prevent the self-heating effect of the thin film transistor from affecting the normal working state.

BRIEF DESCRIPTION OF THE DRAWINGS

In order to clearly illustrate the technical solution of the embodiments of the disclosure, a brief introduction of the necessary figures in the description of the embodiments will be made. It is obvious that the drawings in the description below are merely some embodiments of the disclosure, a person skilled in the art may obtain other drawings according to these drawings without creative efforts. In the figures.

DETAILED DESCRIPTION OF PREFERRED EMBODIMENTS

The technical solutions in the embodiments of the disclosure will be described clearly and completely hereinafter with reference to the accompanying drawings in the embodiments of the disclosure. It is obvious that the described embodiments are merely some but not all of the embodiments of the disclosure. All other embodiments obtained by a person skilled in the art based on the embodiments of the disclosure without creative efforts shall fall within the protection scope of the disclosure.

Figure 1:
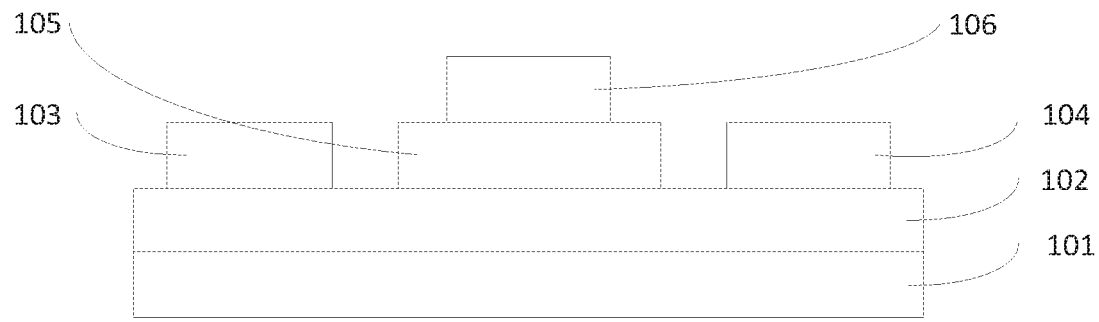
FIG. 1 is a schematic structural view of an embodiment of the thin film transistor of the disclosure.

Refer to FIG. 1, an embodiment of a thin film transistor of the disclosure includes:

a substrate 101;

an active layer 102 arranged on the substrate 101;

a source 103 and a drain 104 arranged on the active layer 102;

a gate insulating layer 105 arranged on the active layer 102 and arranged in the same layer as the source 103 and the drain 104;

wherein the source 103 and the drain 104 are located on two sides of the gate insulating layer 105, respectively, and the source 103 and the drain 104 are not in contact with the gate insulating layer 105;

a gate 106 arranged on the gate insulating layer 105.

Wherein an area of the gate 106 is less than or equal to an area of the gate insulating layer 105.

Optionally, the substrate 101 and/or the gate insulating layer 105 are/is a heat conductive material as a heat transmitting layer. When the substrate 101 is a heat transmitting layer, the heat transmitting layer is located on a side of the active layer 102 far away from the gate insulating layer 105, and the gate insulating layer 105 may be a material with a general thermal conductivity such as silicon nitride or silicon oxide. When the gate insulating layer 105 is a heat transmitting layer, the heat transmitting layer is located between the active layer 102 and the gate 106. The substrate 101 may be a material with a general thermal conductivity, such as glass, plastic, or the like.

Optionally, the heat transmitting layer may be a material with good insulation and good thermal conductivity, such as diamond, diamond-like carbon, high-resistance silicon carbide, beryllium oxide ceramics, boron nitride or aluminum nitride or the like.

Figure 2:
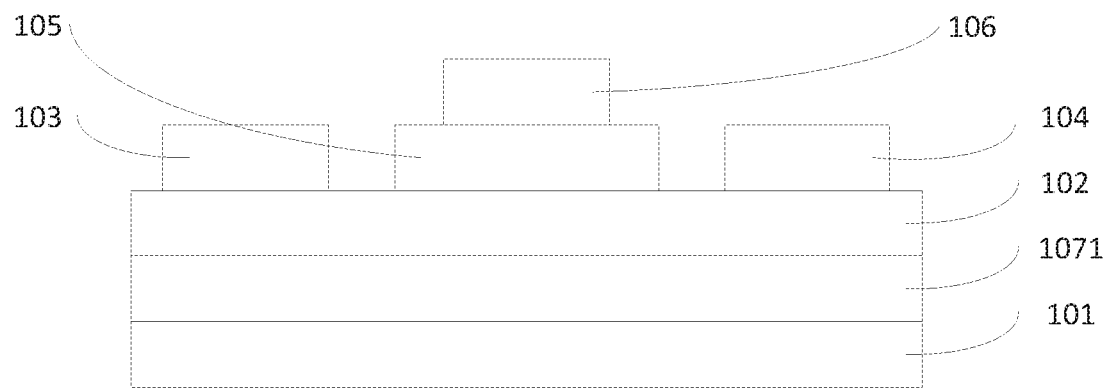
FIG. 2 is an embodiment of the thin film transistor shown in FIG. 1 with a heat transmitting layer added between a substrate and an active layer.

Refer to FIG. 2, FIG. 2 is an embodiment of the thin film transistor shown in FIG. 1 with a heat transmitting layer added between a substrate and an active layer, including a substrate 101, a heat transmitting layer 1071, an active layer 102, a source 103 and a drain 104, a gate insulating layer 105, and a gate 106 sequentially arranged.

Wherein the gate insulating layer 105 is arranged in the same layer as the source 103 and the drain 104, and the source 103 and the drain 104 are respectively located on two sides of the gate insulating layer 105. None of the source 103 and the drain 104 is in contact with the gate insulating layer 105.

Optionally, an area of the heat transmitting layer 1071 is equal to an area of the active layer 102 to be in contact with the active layer 102 to the maximized extent, so as to help dissipate the heat of the active layer 102.

Figure 3:
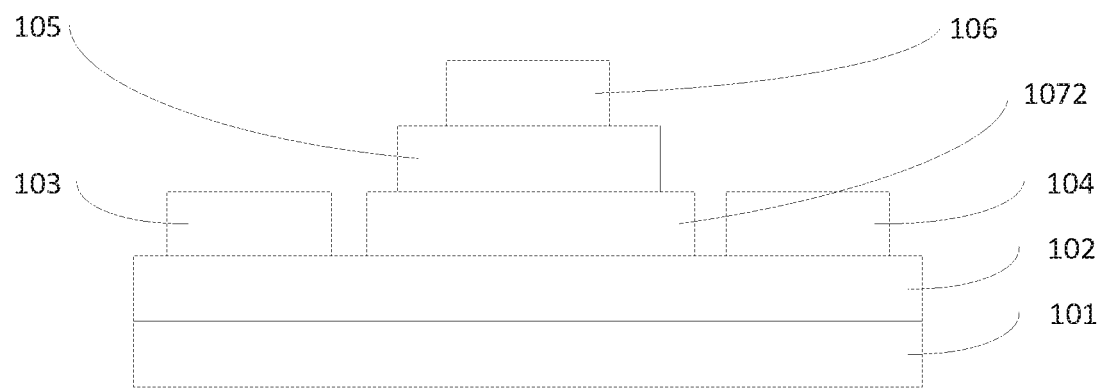
FIG. 3 is an embodiment of the thin film transistor shown in FIG. 1 with a heat transmitting layer added between an active layer and a gate insulating layer.

Refer to FIG. 3, FIG. 3 is an embodiment of the thin film transistor shown in FIG. 1 with a heat transmitting layer added between an active layer and a gate insulating layer, including a substrate 101, an active layer 102, a source 103 and a drain 104, a heat transmitting layer 1072, a gate insulating layer 105, and a gate 106 sequentially arranged.

Wherein the heat transmitting layer 1072 is arranged in the same layer as the source 103 and the drain 104, and the source 103 and the drain 104 are respectively located on two sides of the heat transmitting layer 1072. None of the source 103 and the drain 104 is in contact with the heat transmitting layer 1072.

Optionally, an area of the heat transmitting layer 1072 is greater than or equal to an area of the gate insulating layer 105 to be in contact with the active layer 102 to the maximized extent, so as to help dissipate the heat of the active layer 102.

In other embodiments, the source 103 and the drain 104 may also be arranged on the heat transmitting layer 1072, and a region of the heat transmitting layer 1072 corresponding to the source 103 and the drain 104 is a heat conductive material, so that the source 103 and the drain 104 are electrically connected with the active layer 102.

Figure 4:
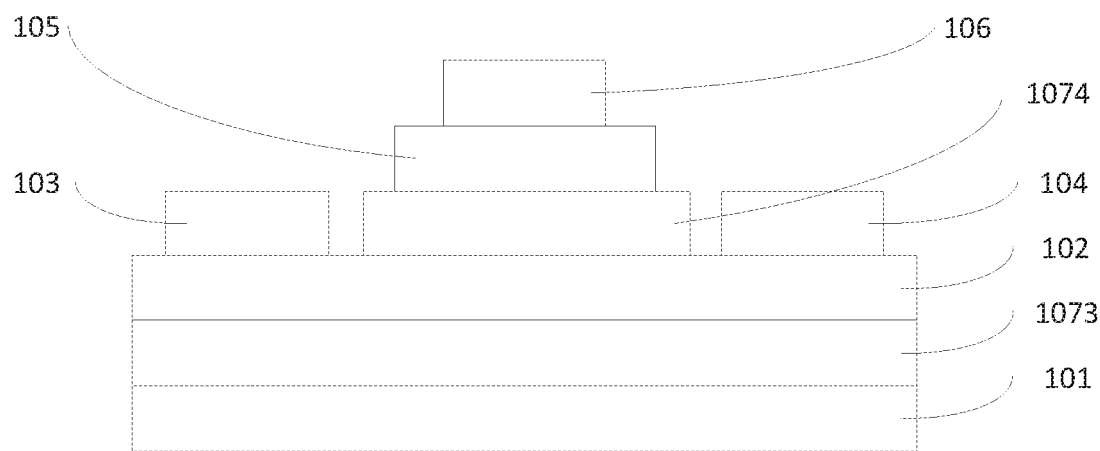
FIG. 4 is an embodiment of the thin film transistor shown in FIG. 1 with a heat transmitting layer added between a substrate and an active layer and between an active layer and a gate insulating layer, respectively.

Refer to FIG. 4, FIG. 4 is an embodiment of the thin film transistor shown in FIG. 1 with a heat transmitting layer added between a substrate and an active layer and between an active layer and a gate insulating layer, respectively, and including a substrate 101, a first heat transmitting layer 1073, an active layer 102, a source 103 and a drain 104, a second heat transmitting layer 1074, a gate insulating layer 105 and a gate 106 sequentially arranged.

Wherein the second heat transmitting layer 1074 is arranged in the same layer as the source 103 and the drain 104, and the source 103 and the drain 104 are respectively located on two sides of the second heat transmitting layer 1074. The source 103 and the drain 104 are not in contact with the second heat transmitting layer 1074.

Optionally, an area of the first heat transmitting layer 1073 is equal to an area of the active layer 102, and an area of the second heat transmitting layer 1074 is greater than or equal to an area of the gate insulating layer 105, so that the first heat transmitting layer 1073 and the second heat transmitting layer 1074 are in contact with the active layer 102 to the maximized extent, so as to help dissipate the heat of the active layer 102.

In the disclosure, the heat transmitting layer is arranged on one side of the active layer of the thin film transistor, so that the heat of the active layer may be promptly conducted to the surrounding environment, so as to prevent the self-heating effect of the thin film transistor from affecting the normal working state.

Figure 5:
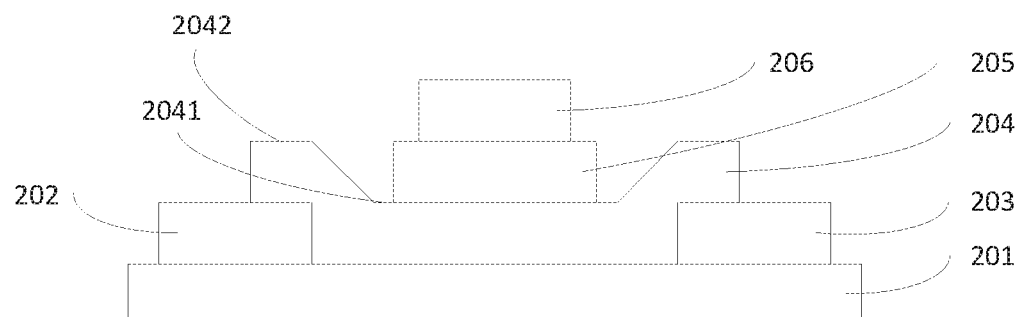
FIG. 5 is another embodiment of the thin film transistor of the disclosure.

Refer to FIG. 5, FIG. 5 is another embodiment of the thin film transistor of the disclosure, including:

a substrate 201;

a source 202 and a drain 203 arranged on the substrate 201;

an active layer 204 arranged on the substrate 101 and covering a portion of the source 202 and the drain 203, respectively;

a gate insulating layer 205 arranged on the active layer 204;

a gate 206 arranged on the gate insulating layer 205.

Wherein the active layer 204 is provided with a concave surface 2041, the gate insulating layer 205 is arranged on the concave surface 2041, and a contact surface between the gate insulating layer 205 and the gate 306 is aligned with a top surface 2042 of an edge of the active layer 204.

Wherein an area of the gate 206 is less than or equal to an area of the gate insulating layer 205.

Optionally, the substrate 201 and/or the gate insulating layer 205 are/is a heat conductive material as a heat transmitting layer. When the substrate 201 is a heat transmitting layer, the heat transmitting layer is located on a side of the active layer 204 far away from the gate insulating layer 205, and the gate insulating layer 205 may be a material with a general thermal conductivity such as silicon nitride or silicon oxide. When the gate insulating layer 205 is a heat transmitting layer, the heat transmitting layer is located between the active layer 204 and the gate 206. The substrate 201 may be a material with a general thermal conductivity, such as glass, plastic, or the like.

Optionally, the heat transmitting layer may be a material with good insulation and good thermal conductivity, such as diamond, diamond-like carbon, high-resistance silicon carbide, beryllium oxide ceramics, boron nitride or aluminum nitride or the like.

Optionally, both the substrate 201 and the gate insulating layer 205 may be heat transmitting layers, which are located on two sides of the active layer 202, respectively.

Figure 6:
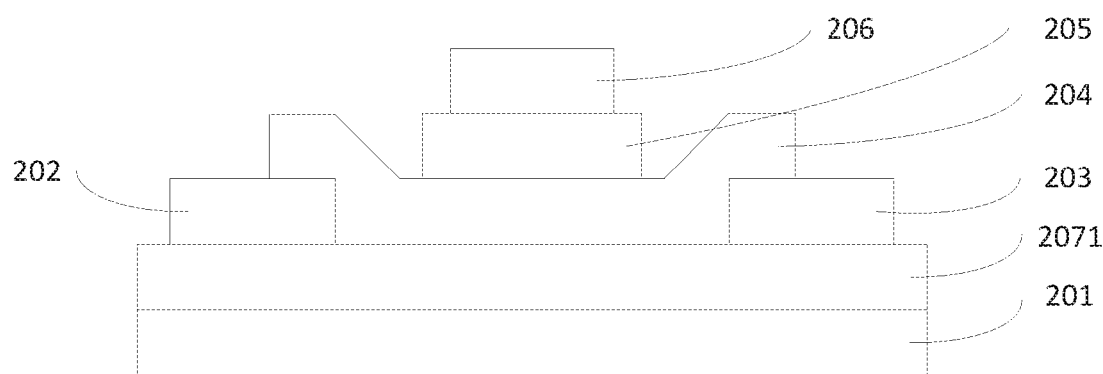
FIG. 6 is an embodiment of a thin film transistor as shown in FIG. 5 with a heat transmitting layer added between a substrate and an active layer.

Refer to FIG. 6, FIG. 6 is an embodiment of a thin film transistor as shown in FIG. 5 with a heat transmitting layer added between a substrate and an active layer, including a substrate 201, a heat transmitting layer 2071, a source 202 and a drain 203, an active layer 204, a gate insulating layer 205, and gate 206 sequentially arranged.

Wherein the active layer 204 is arranged in the same layer as the source 202 and the drain 203, and covers a part of the source 202 and the drain 203, respectively.

Optionally, an area of the heat transmitting layer 2071 is greater than or equal to an area of the active layer 204 to be in contact with the active layer 204 to the maximized extent, so as to help dissipate the heat of the active layer 204.

Figure 7:
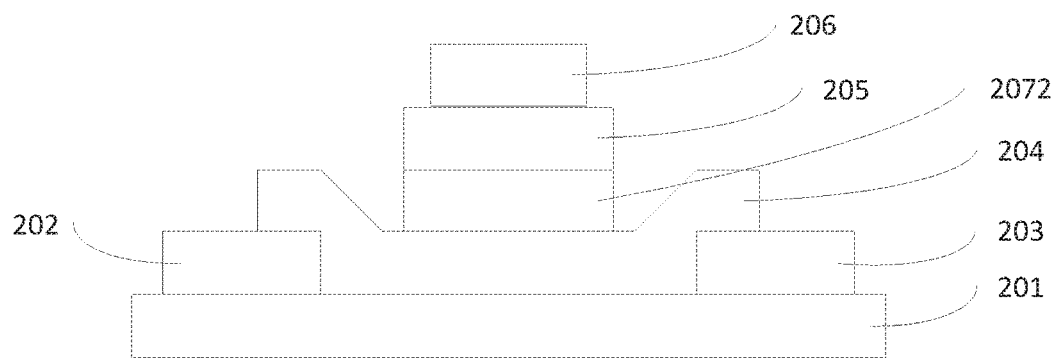
FIG. 7 is an embodiment of the thin film transistor shown in FIG. 5 with a heat transmitting layer added between an active layer and a gate insulating layer.

Refer to FIG. 7, FIG. 7 is an embodiment of the thin film transistor shown in FIG. 5 with a heat transmitting layer added between an active layer and a gate insulating layer, and including a substrate 201, a source 202 and a drain 203, an active layer 204, a heat transmitting layer 2072, a gate insulating layer 205, and a gate 206 sequentially arranged.

Wherein the active layer 204 is arranged in the same layer as the source 202 and the drain 203, and covers a part of the source 202 and the drain 203, respectively.

Optionally, an area of the heat transmitting layer 2072 is greater than or equal to an area of the gate insulating layer 205 to be in contact with the active layer 204 to the maximized extent, so as to help dissipate the heat of the active layer 204.

Figure 8:
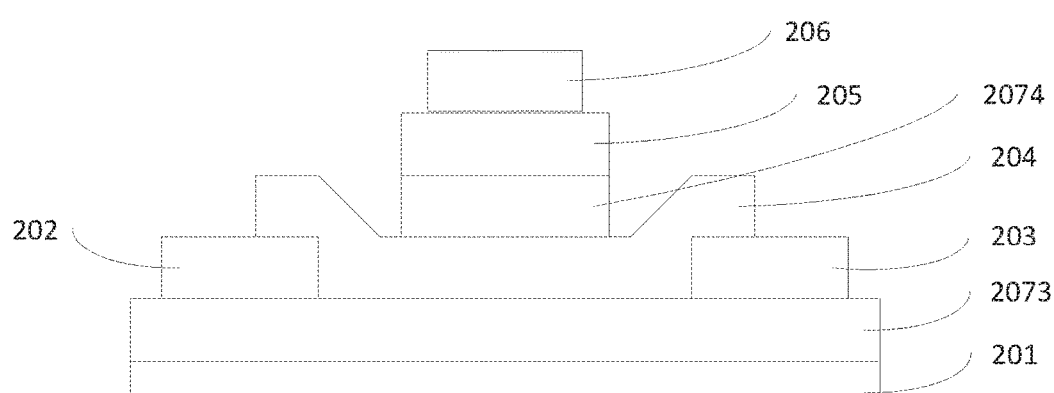
FIG. 8 is an embodiment of the thin film transistor shown in FIG. 5 with a heat transmitting layer added between a substrate and an active layer and between an active layer and a gate insulating layer, respectively.

Refer to FIG. 8, FIG. 8 is an embodiment of the thin film transistor shown in FIG. 5 with a heat transmitting layer added between a substrate and an active layer and between an active layer and a gate insulating layer, respectively, and including a substrate 201, a first heat transmitting layer 2073, a source 202 and a drain 203, an active layer 204, a second heat transmitting layer 2074, a gate insulating layer 205 and a gate 206 sequentially arranged.

Wherein the active layer 204 is arranged in the same layer as the source 202 and the drain 203, and covers a part of the source 202 and the drain 203, respectively.

Optionally, an area of the first heat transmitting layer 2073 is greater than or equal to an area of the active layer 204, and an area of the second heat transmitting layer 2074 is greater than or equal to an area of the gate insulating layer 205 to be in contact with the active layer 204 to the maximized extent, so as to help dissipate the heat of the active layer 204.

In the disclosure, the heat transmitting layer is arranged on one side of the active layer of the thin film transistor, so that the heat of the active layer may be promptly conducted to the surrounding environment, so as to prevent the self-heating effect of the thin film transistor from affecting the normal working state.

Figure 9:
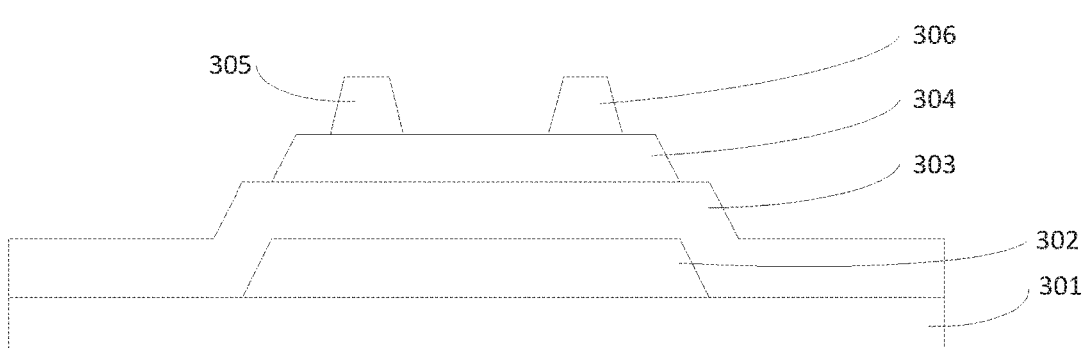
FIG. 9 is yet another embodiment of the thin film transistor of the disclosure.

Refer to FIG. 9, FIG. 9 is yet another embodiment of the thin film transistor of the disclosure, including:
a substrate 301;
a gate 302 arranged on the substrate 301;

a gate insulating layer 303 arranged on the gate 302 and completely covering the gate 302;
an active layer 304 arranged on the gate insulating layer 303;
a source 305 and a drain 306 arranged on the active layer 304, and the source 305 and the drain 306 arranged in the same layer but being not in contact with each other.

Optionally, the gate insulating layer 303 is a heat conductive material as a heat transmitting layer. The heat transmitting layer is located on a side of the active layer 304 far away from the source 305 and the drain 306 and the gate insulating layer 303 may be a material with good insulation and good thermal conductivity, such as diamond, diamond-like carbon, high-resistance silicon carbide, beryllium oxide ceramics, boron nitride or aluminum nitride or the like.

Figure 10:
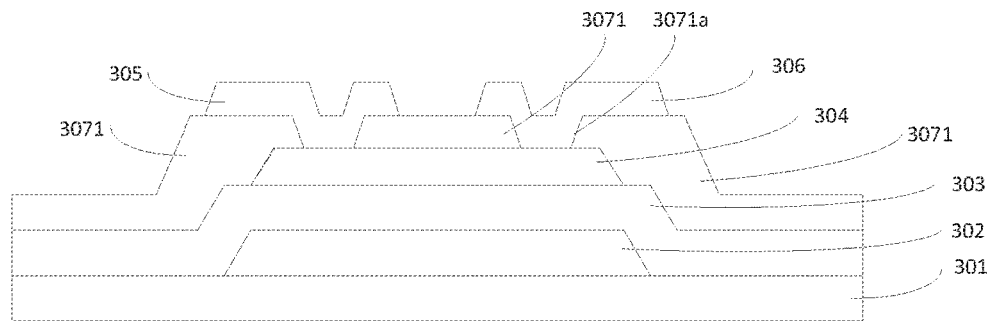
FIG. 10 is an embodiment of the thin film transistor shown in FIG. 9 with a heat transmitting layer added on a side of the active layer far away from the gate insulating layer.

Refer to FIG. 10, FIG. 10 is an embodiment of the thin film transistor shown in FIG. 9 with a heat transmitting layer added on a side of the active layer far away from the gate insulating layer, including a substrate 301, a gate 302, a gate insulating layer 303, an active layer 304, a heat transmitting layer 3071, a source 305, and a drain 306.

Wherein the heat transmitting layer 3071 covers the active layer 304 and has an opening 3071a corresponding to the source 305 and the drain 306. The source 305 and the drain 306 are electrically connected with the active layer 304 through the opening 3071a.

Figure 11:
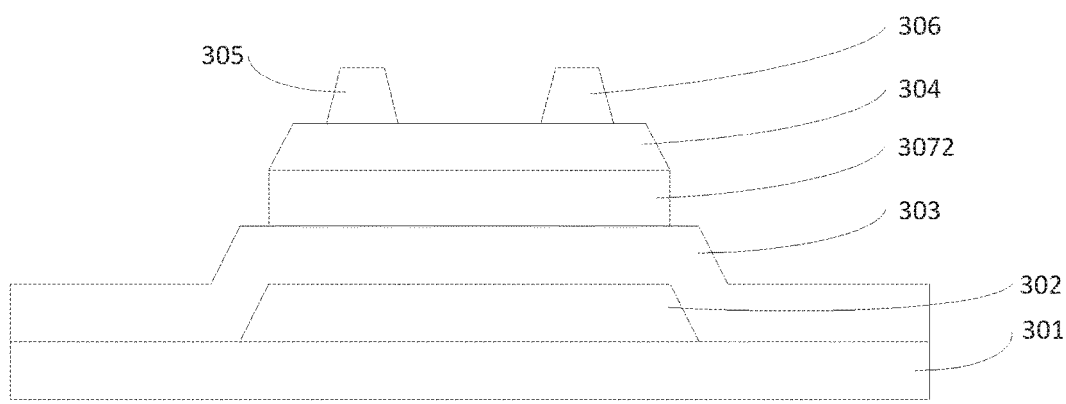
FIG. 11 is an embodiment of the thin film transistor of FIG. 9 with a heat transmitting layer added between an active layer and a gate insulating layer.

Refer to FIG. 11, FIG. 11 is an embodiment of the thin film transistor of FIG. 9 with a heat transmitting layer added between an active layer and a gate insulating layer, and including a substrate 301, a gate 302, a gate insulating layer 303, a heat transmitting layer 3072, an active layer 304, a source 305, and a drain 306 sequentially arranged.

Optionally, an area of the heat transmitting layer 3072 is greater than or equal to an area of the active layer 304 to be in contact with the active layer 304 to the maximized extent, so as to help dissipate the heat of the active layer 204.

Figure 12:
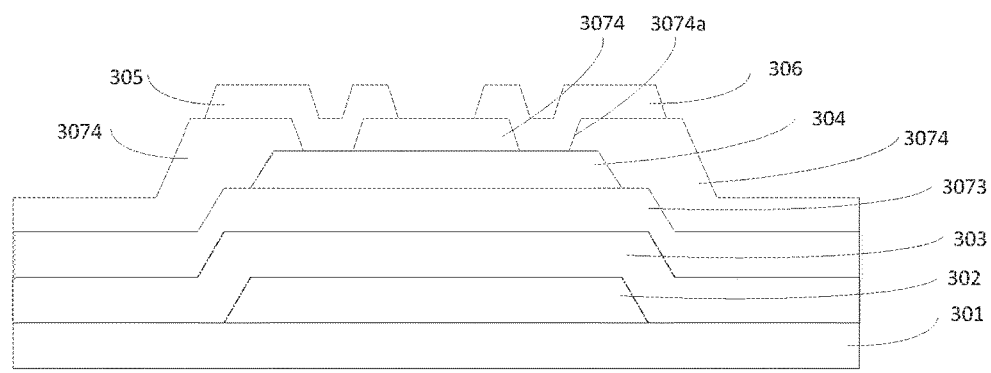
FIG. 12 is an embodiment of the thin film transistor shown in FIG. 9 with a heat transmitting layer on a side of the active layer far away from the gate insulating layer and between the active layer and the gate insulating layer.

Refer to FIG. 12, FIG. 12 is an embodiment of the thin film transistor shown in FIG. 9 with a heat transmitting layer on a side of the active layer far away from the gate insulating layer and between the active layer and the gate insulating layer, and including a substrate 301, a gate 302, a gate insulating layer 303, a first heat transmitting layer 3073, an active layer 304, a second heat transmitting layer 3074, a source 305, and a drain 306 sequentially arranged.

Wherein the second heat transmitting layer 3074 covers the active layer 304 and has an opening 3074a corresponding to the source 305 and the drain 306. The source 305 and the drain 306 are electrically connected with the active layer 304 through the opening 3074a.

Optionally, an area of the first heat transmitting layer 3073 is greater than or equal to an area of the active layer 304 to be in contact with the active layer 304 to the maximized extent, so as to help dissipate the heat of the active layer 304.

In the disclosure, the heat transmitting layer is arranged on one side of the active layer of the thin film transistor, so that the heat of the active layer may be promptly conducted to the surrounding environment, so as to prevent the self-heating effect of the thin film transistor from affecting the normal working state.

Figure 13:
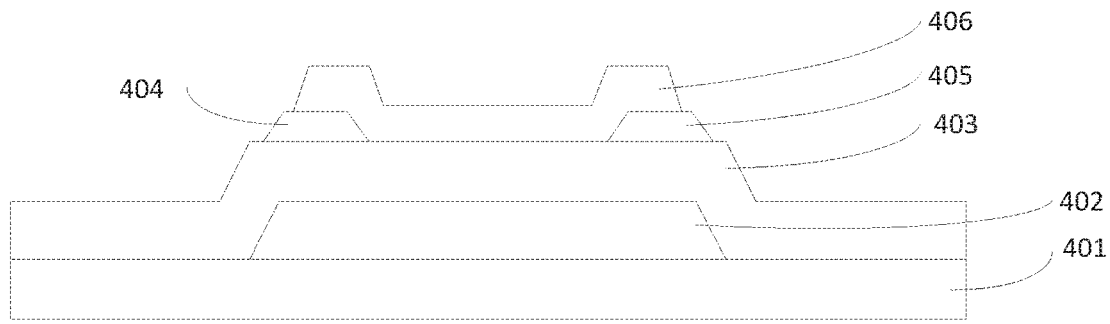
FIG. 13 is another embodiment of the thin film transistor of the disclosure.

Refer to FIG. 13, FIG. 13 is another embodiment of the thin film transistor of the disclosure, including:
a substrate 401;
a gate 402 arranged on the substrate 401;
a gate insulating layer 403 arranged on the gate 402 and completely covering the gate 302;

a source 404 and a drain 405 arranged on the active layer 304, the source 305 and the drain 306 arranged in the same layer but not being in contact with each other;

an active layer 406 arranged on the gate insulating layer 403 and covering a portion of the source 404 and the drain 405, respectively.

Optionally, the gate insulating layer 403 is a heat conductive material as a heat transmitting layer. The heat transmitting layer is located on a side of the active layer 406 far away from the source 404 and the drain 405. The gate insulating layer 403 may be a material with good insulation and good thermal conductivity, such as diamond, diamond-like carbon, high-resistance silicon carbide, beryllium oxide ceramics, boron nitride or aluminum nitride or the like.

Figure 14:
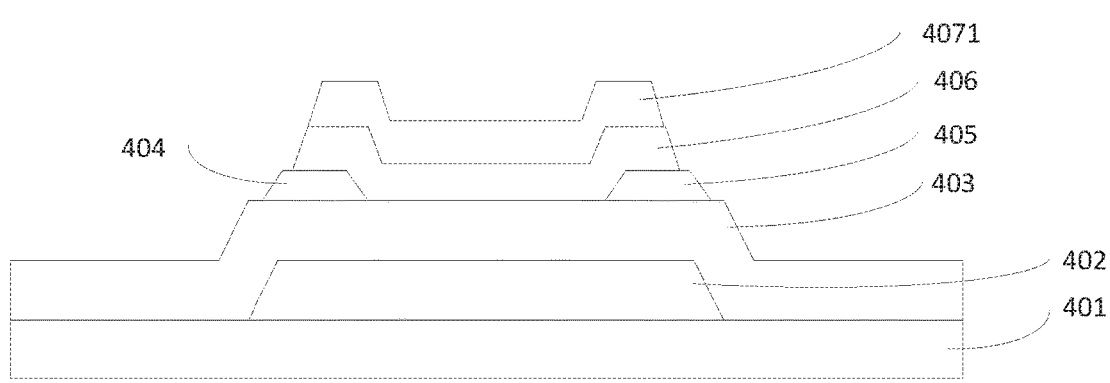
FIG. 14 is an embodiment of the thin film transistor shown in FIG. 9 with a heat transmitting layer added on a side of the active layer far away from the gate insulating layer.

Refer to FIG. 14, FIG. 14 is an embodiment of the thin film transistor shown in FIG. 9 with a heat transmitting layer added on a side of the active layer far away from the gate insulating layer, including a substrate 401, a gate 402, a gate insulating layer 403, a source 404 and a drain 405, an active layer 406, and a heat transmitting layer 4071.

Optionally, an area of the heat transmitting layer 4071 is greater than or equal to an area of the active layer 406 to be in contact with the active layer 406 to the maximized extent, so as to help dissipate the heat of the active layer 406.

Figure 15:
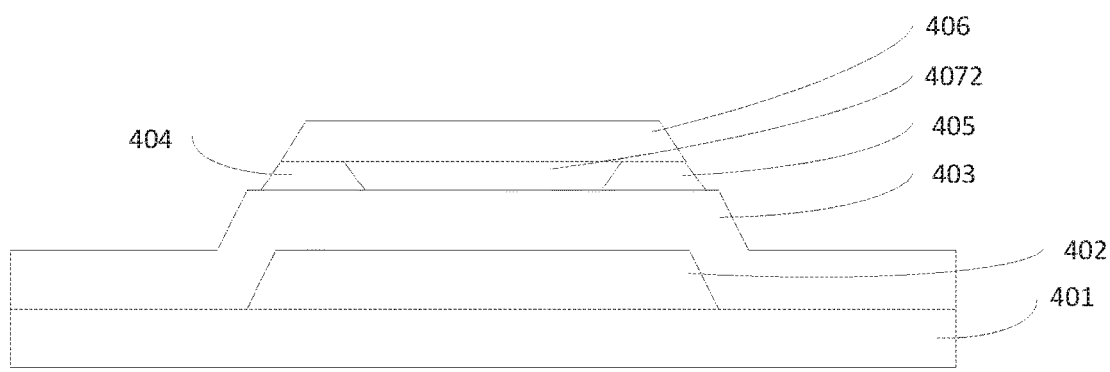
FIG. 15 is an embodiment of the thin film transistor shown in FIG. 13 with a heat transmitting layer added between an active layer and a gate insulating layer.

Refer to FIG. 15, FIG. 15 is an embodiment of the thin film transistor shown in FIG. 13 with a heat transmitting layer added between an active layer and a gate insulating layer, and including a substrate 401, a gate 402, a gate insulating layer 403, a source 404 and a drain 405, a heat transmitting layer 4072, and an active layer 406.

Wherein the heat transmitting layer 4072 is arranged in the same layer as the source 404 and the drain 405 and between the source 404 and the drain 405. The active layer 406 is electrically connected with the source 404 and the drain 405, respectively.

Optionally, an area of the heat transmitting layer 4072 is equal to an area of a surface of the active layer 406 excluding a surface connected with the source 404 and the drain 405 to be in contact with the active layer 406 to the maximized extent, so as to help dissipate the heat of the active layer 406.

In other embodiments, the heat transmitting layer 4072 may also cover portions of the source 404 and the drain 405 to increase a contact area with the active layer 406.

Figure 16:
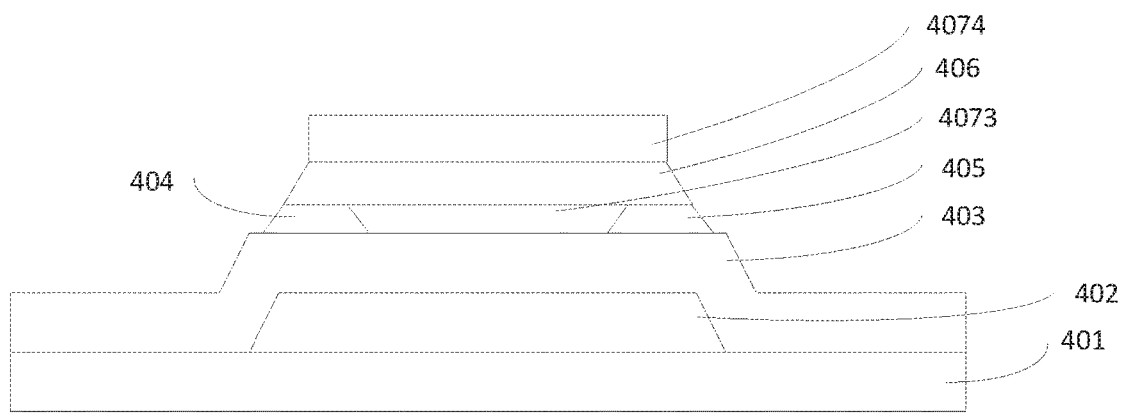
FIG. 16 is an embodiment of the thin film transistor shown in FIG. 13 with a heat transmitting layer on a side of the active layer far away from the gate insulating layer and between the active layer and the gate insulating layer.

Refer to FIG. 16, FIG. 16 is an embodiment of the thin film transistor shown in FIG. 13 with a heat transmitting layer on a side of the active layer far away from the gate insulating layer and between the active layer and the gate insulating layer, and including a substrate 401, a gate 402, a gate insulating layer 403, a source 404 and a drain 405, a first heat transmitting layer 4073, an active layer 406, and a second heat transmitting layer 4074 sequentially arranged.

Wherein the first heat transmitting layer 4073 is arranged in the same layer as the source 404 and the drain 405 and between the source 404 and the drain 405. The active layer 406 is electrically connected with the source 404 and the drain 405, respectively.

Optionally, an area of the first heat transmitting layer 4073 is equal to an area of a surface of the active layer 406 excluding a surface connected with the source 404 and the drain 405, and an area of the second heat transmitting layer 4074 is greater than or equal to an area of the active layer 406 to be in contact with the active layer 406 to the maximized extent, so as to help dissipate the heat of the active layer 406.

In the disclosure, the heat transmitting layer is arranged on one side of the active layer of the thin film transistor, so that the heat of the active layer may be promptly conducted to the surrounding environment, so as to prevent the self-heating effect of the thin film transistor from affecting the normal working state.

The above are only the embodiments of the disclosure, and are not intended to limit the scope of the disclosure. All equivalent structures or equivalent processes using the description of the disclosure and the accompanying drawings are directly or indirectly used in other related technologies are all included in the patent protection scope of the disclosure.

What is claimed is:

1. A thin film transistor, comprising: a gate, a source, a drain, an active layer and a heat transmitting layer;
   wherein the heat transmitting layer is arranged on at least one side of the active layer;
   wherein the thin film transistor further comprises:
   a substrate and a gate insulating layer;
   the gate is arranged on the substrate;
   the gate insulating layer is arranged on the gate, and the active layer is arranged on the gate insulating layer;
   the source and the drain are arranged on the active layer, or the source and the drain are arranged on the gate insulating layer and partially covered by the active layer.

2. The thin film transistor according to claim 1, wherein the gate insulating layer is a heat conductive material as an additional heat transmitting layer.

3. The thin film transistor according to claim 1, wherein the heat transmitting layer is arranged on a side of the active layer far away from the gate insulating layer and/or between the gate insulating layer and the active layer.

4. The thin film transistor according to claim 3, wherein the heat transmitting layer is provided with an opening, the source and the drain are arranged on the heat transmitting layer and connected with the active layer through the opening.

5. A display device, comprising: a thin film transistor, the thin film transistor comprising:
   a gate, a source, a drain, an active layer and a heat transmitting layer;
   wherein the heat transmitting layer is arranged on at least one side of the active layer; and
   wherein the thin film transistor further comprises:
   a substrate and a gate insulating layer;
   the gate is arranged on the substrate;
   the gate insulating layer is arranged on the gate, and the active layer is arranged on the gate insulating layer;
   the source and the drain are arranged on the active layer, or the source and the drain are arranged on the gate insulating layer and partially covered by the active layer.

6. The display device according to claim 5, wherein the heat transmitting layer is arranged on a side of the active layer far away from the gate insulating layer and/or between the gate insulating layer and the active layer.

* * * * *